United States Patent [19]
Svensson

[11] Patent Number: 5,139,924
[45] Date of Patent: Aug. 18, 1992

[54] METHOD FOR PRODUCING A CIRCUIT BOARD AND A CIRCUIT-BOARD PREFORM FOR USE IN CARRYING OUT THE METHOD

[76] Inventor: Lars-Göran Svensson, S-633 47 Eskilstuna, Lindovagen 10, Sweden

[21] Appl. No.: 438,409
[22] PCT Filed: Jun. 17, 1988
[86] PCT No.: PCT/SE88/00336
  § 371 Date: Dec. 18, 1989
  § 102(e) Date: Dec. 18, 1989
[87] PCT Pub. No.: WO89/00374
  PCT Pub. Date: Jan. 12, 1989

[30] Foreign Application Priority Data

Jun. 30, 1987 [SE] Sweden .............................. 8702704

[51] Int. Cl.$^5$ .................................................. G03C 5/00
[52] U.S. Cl. ...................................... 430/314; 430/312; 430/313; 430/318; 430/319; 427/96; 174/250
[58] Field of Search .................. 427/96; 430/314, 312, 430/320, 313, 318, 319; 174/250

[56] References Cited

U.S. PATENT DOCUMENTS

| | | | |
|---|---|---|---|
| 3,525,617 | 8/1970 | Bingham | 430/318 |
| 4,528,261 | 7/1985 | Hauser | 430/327 |
| 4,642,160 | 2/1987 | Burgess | 430/314 |
| 4,915,983 | 4/1990 | Lake et al. | 430/314 |

Primary Examiner—Marion E. McCamish
Assistant Examiner—Janis L. Dote
Attorney, Agent, or Firm—Sughrue, Mion, Zinn, Macpeak and Seas

[57] ABSTRACT

A method for manufacturing a circuit board on which electronic components and electrical circuits are to be mounted and connected together. The method comprises positioning mutually insulated and mutually intersecting electrical conductors in a layer of substrate material, preferably to form an x/y matrix, and treating the substrate material, with the conductors embedded therein, in a manner to establish interruptions in the various conductor paths at given locations therein, and to establish permanent electrical contact between the intersecting conductor paths at given locations of intersection. The substrate material used is sensitive to a given kind of radiation, and the material is irradiated, while screening those locations at which interruptions are to be established or at which the conductor paths are to be connected together. The material in the non-irradiated locations is then chemically removed, in order to expose the conductors at these locations, whereupon the exposed conductor paths are severed by etching at those locations where interruptions are desired and the conductor paths are mutually connected at the intersection locations where electrical contact is desired, by soldering or metal plating techniques. The invention also relates to a preform for use in manufacturing a circuit board in accordance with the method.

7 Claims, 7 Drawing Sheets

METHOD FOR PRODUCING A CIRCUIT BOARD AND A CIRCUIT-BOARD PREFORM FOR USE IN CARRYING OUT THE METHOD

The present invention relates to a method for producing a circuit board on which electronic components and electrical circuits are to be mounted and connected together, wherein mutually electrically isolated and intersection electrical conductors are placed in a substrate layer, suitably to form an X/Y matrix, and the substrate layer together with the conductors encapsulated therein is treated in a manner to establish interruptions in the various conductor paths at specific locations therealong and to establish permanent electrical contact between mutually intersection conductor paths at given points of intersection. The invention also relates to a circuit-board preform for carrying out the method in the production of such circuit boards.

Conventionally, the conductor pattern or lay-out on a circuit board is produced with the combined aid of photographic and printing techniques. This process is both time consuming and expensive, however, especially when producing prototype boards or boards in small series. The problems encountered in the manufacture of such circuit boards increase with the development of progressively smaller components and circuits which are required to be placed in very close proximity with one another on such circuit boards. In this case, it is normally necessary to configure the conductor lay-out in several layers in the board, which makes the board still more expensive and still more difficult to produce; among other things because it is normally necessary to drill connecting holes through the board layers and to plate the holes, in order to establish the requisite electrical connections between the various layers.

In order to simplify the procedure required to achieve desired conductor patterns or lay-outs, the manufacturers of such circuit boards have recently begun to use a technique which is smaller to the older so-called wiring technique, in which insulated conductors are drawn between and connected to desired points on a circuit board with the aid of a complicated machine; c.f. for instance U.S. Pat. No. 3,674,914. This technique requires the conductor to be glued to the circuit board and is also time consuming and costly.

The present invention is based on the realization that a circuit board which is to carry closely packed electrical conductors and circuits having desired conductor lay-outs could be produced in a much simpler and far less expensive manner, by using a single layer foil or thin plate having embodied therein a conductor arrangement, suitably an x/y matrix, of closely packed, insulated conductors. The desired conductor pattern can then be established by breaking the various conductor paths at given points of intersection. This assumes, however, that reliable connections can be established easily between the conductor lay-out encapsulated in the foil and suitable contact points for external electrical components and circuits, and that the aforesaid breaks or interruptions in the conductor paths can be effected rationally.

A technique of this general kind is described in Canadian Patent No. 919 819, this technique utilizing a catalytic substrate material. In this case, for the purpose of establishing contact with the conductors in the conductor pattern, or conductor lay-out, the conductors are first drilled and the wall of the resultant holes then plated.

The plating is intended to be in electrical contact with the cut surfaces of the conductors. Thus, this known method requires holes to be drilled individually at all intersection points, which represents a highly time-consuming procedure. Furthermore, electrical contact with the conductors is established solely at the points of connection with the cut conductor surfaces. This procedure cannot be relied upon to be effective when using very thin conductors and when the contact between the cut conductor surfaces and the plating is subjected to stresses engendered by temperature-induced movement between the conductive material and the substrate or base material. Because of the difficulty in achieving an acceptable electrical contact with all conductors, all circuit boards produced by this technique must be carefully checked and subsequent manual adjustments made. The number of rejects resulting from this method is also very high.

One object of the present invention is to provide a circuit board manufacturing method of the kind described in the introduction in which, inter alia, the aforesaid drawbacks are no longer found. Thus, the method shall enable all of the holes required to be formed simultaneously in only a few working steps, and the establishment of a reliable connection between the desired conductor paths themselves and between these conductor paths and external components and circuits by not drilling the conductors at the contact points.

Another object of the invention is to provide an apparatus for use when carrying out the method.

The method according to the invention is mainly characterized by using a substrate material which is sensitive to given kinds of radiation; by irradiating the substrate material while screening the locations at which interruptions are to be established in the conductor paths or at which the conductor paths are to be mutually connected; by chemically removing the material in the non-irradiated locations of the substrate, such as to expose the conductors at these locations; and by severing the exposed conductor paths by etching at those locations at which a break is desired and soldering or plating the conductors together at the intersection points at which electrical contact is desired.

This method ensures, inter alia, that electrical contact with desired conductor paths is achieved around the entire circumference of the conductors, and thus not solely at small cut surfaces. Irradiation of the substrate is also effected in a single process or step, as is also the subsequent chemical removal of material from the non-irradiated substrate locations, which greatly rationalizes the hole forming process.

Preferably non-insulated electrical conductors are used, the requisite electrical isolation of adjacent conductors being achieved by mutual separation of the conductors in and mutual insulation of the conductors by the substrate material.

The substrate material used is preferably ne which will harden when irradiated with electromagnetic radiation of a given frequency, wherewith the material present in non-irradiated regions, which are thus surrounded by hard material, can be removed by a developing process. It is also preferred to apply electrically conductive foil to that side of the substrate which is not irradiated; to remove the substrate material in the non-irradiated regions down to the foil; and to connect the conductor paths to one another and to the electrically conductive foil at the intersection points where electrical contact is desired. The foil is then etched to produce the desired conductor pattern for the electrical connection of external components and circuits. Etching of the foil can be carried at the same time as the conductor paths are etched to produce the aforesaid breaks, or interruptions, in said paths.

The substrate may comprise foil on a stiffening base and the substrate is conveniently complemented with an electrically conductive foil which faces towards the irradiated surface of the substrate and which functions as an earthing surface.

The significant characteristic features of the preform for carrying out the inventive methods are set forth in the following claims.

The invention will now be described in more detail with reference to the accompanying schematic drawings which illustrate the principle features of the invention and in which FIG. 1 is a perspective view of a foil substrate which encapsulates a conductor matrix;

Figure 1:
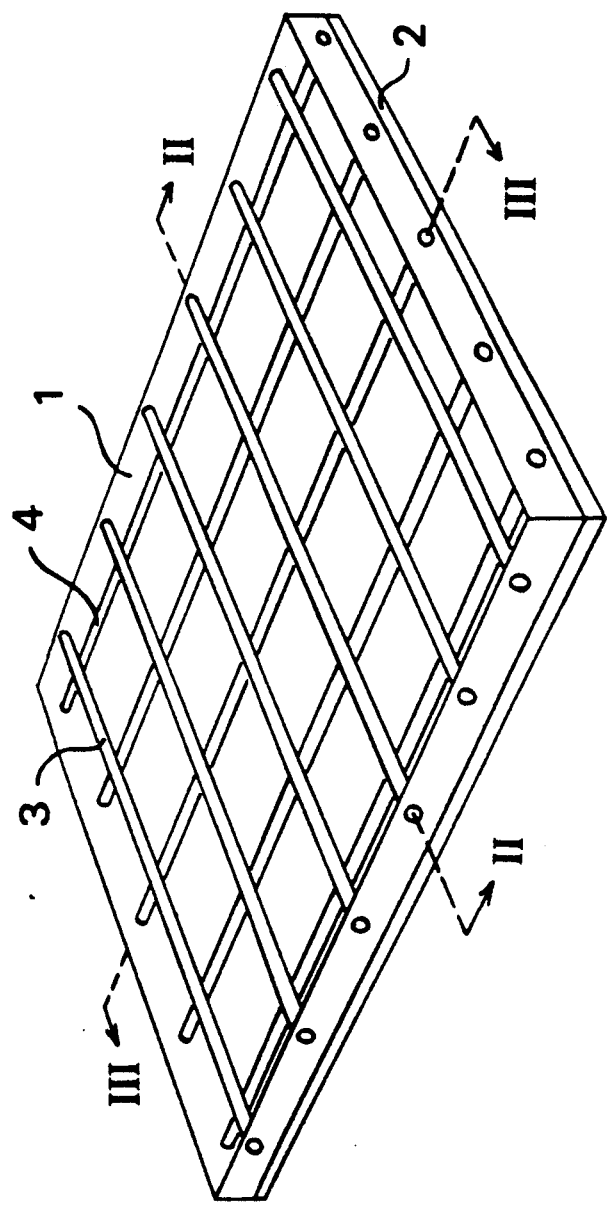

FIG. 1 illustrates a thin substrate-forming sheet or foil material 1 which is sensitive to irradiated ultraviolet light. The substrate material is of a kind which hardens when irradiated, so as to become resistant to a subsequent developing process by means of which non-irradiated material can be loosened and removed. The substrate material may comprise a so-called photopolymer, e.g. a varnish of the kind sold by Lackwerke Paters GmbH solder Co. KG, Kempen West Germany under the registered trade mark ELPEMER ®. Such a material is a good insulator and is also highly temperature stable. The substrate is irradiated with ultraviolet light within the range of 350–400 mm whereas development is effected either with the developing agent HP 5955 or butyldiglycol. The substrate may also comprise, for instance, a photopolymer film of the kind sold by DuPont, Geneve, Switzerland, under the trade mark VACREL ®.

Figure 2:
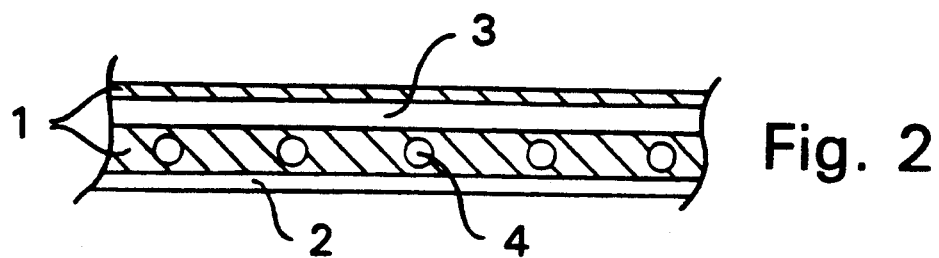
FIG. 2 is a sectional view of the substrate taken on the line II—II in FIG. 1.
Figure 3:
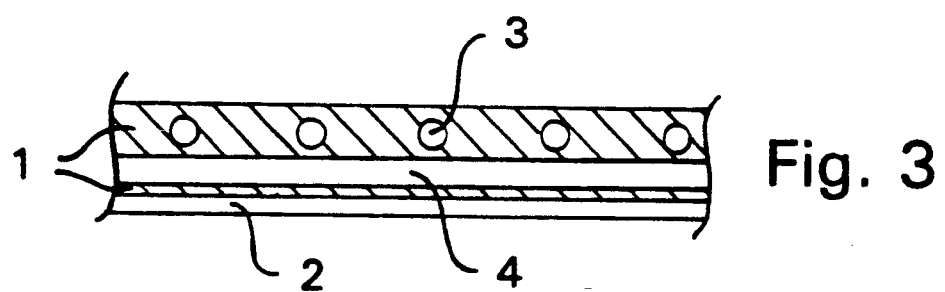
FIG. 3 is a sectional view of the substrate taken on the line III—III in FIG. 1.

In the case of the illustrated embodiment, one surface of the foil 1 has affixed thereon a further thin, electrically conductive foil 2 preferably a copper foil. Non-insulated electrical conductors 3 and 4 are arranged in narrow spaced relationship in the foil 1, to form an x/y matrix. Since the conductors 3 and 4 of the illustrated embodiment are not electrically insulated, the conductors are located at mutually different levels in the foil material 1, which therewith serves to isolate effectively the electrical conductors of adjacent conductor paths, see the section view of FIGS. 2 and 3.

Figure 4:
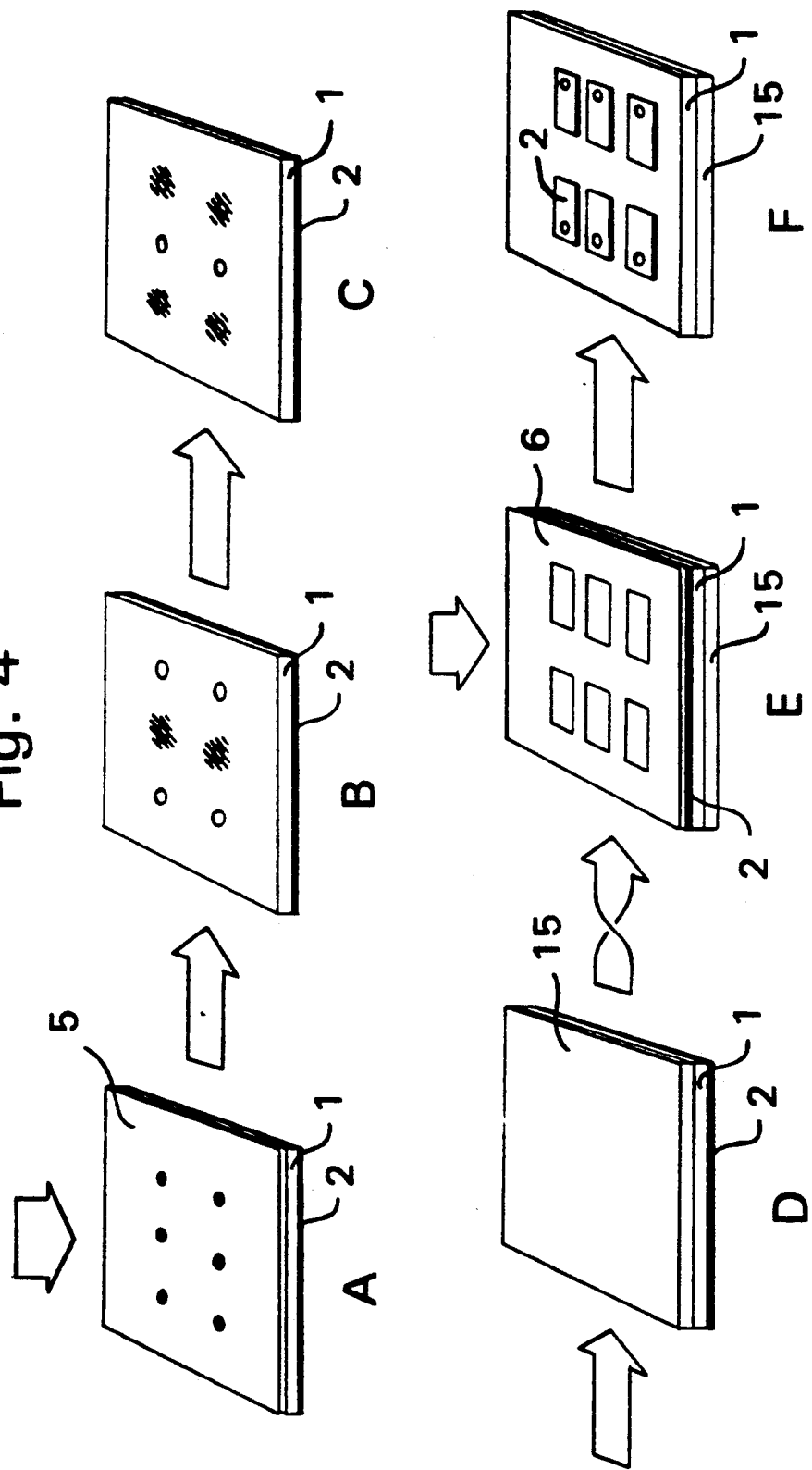
FIG. 4 illustrates a method of manufacturing a circuit card from a foil substrate according to FIG. 1.

FIG. 4 illustrates a method of manufacture in accordance with the invention, wherein in step A the photosensitive surface of the foil 1 is irradiated with ultraviolet light, causing the foil 1 to harden. The ultraviolet light is passed through a film or mask 5 having parts which are impermeable to the ultraviolet radiation and which correspond to those locations on the conductor matrix in the foil 1 wherein the conductor paths are to be interrupted or a connection made. Subsequent to removing the film 5, the exposed foil is developed so that non-hardened material at said unexposed locations is removed to expose the conductor paths at said locations, the material removed at said locations forming essentially cylindrical and well defined bodies which are completely surrounded by hardened material.

Step B involves masking those locations where connections are to be made between mutually intersecting conductor paths, whereafter an etching process is carried out in a manner to establish an interruption in the conductor paths exposed to the etching agent.

In step C the masking used in step B is removed and the openings were the preceding etching process resulted in interruptions in the conductor paths are masked. The freely exposed, intersecting conductor paths in the exposed openings are then plated or soldered. Plating or soldering of these intersecting conductor paths also establishes a connection with the underlying copper foil 2, provided that the copper foil has not been removed at these locations. Soldering can be effected with flow soldering apparatus or by dipping the substrate in a solder bath.

For the purpose of stiffening the foils 1 and 2 in order to provide a manageable board, a stiffening base sheet 15 is placed on the foil 1 in step D. The base material may comprise an epoxy resin reinforced with glass fiber. An earthing surface in the form of a copper foil sheet is preferably applied to the surface of the base sheet facing the foil 1. When the earthing surface and the copper foil 2 are located symmetrically in relation to the conductors, a well defined and constant impedance is obtained over the whole of the board. The resultant board is then turned and holes are drilled at those locations at which external components and circuits are to be mounted on and connected to the board.

The desired conductor patterns or lay-outs of the copper foil 2 for connection with external components and circuits are effected in step E in a conventional manner, by exposing an applied photo-sensitive layer with light through a film 6 having the desired pattern. The substrate is then developed and the copper foil etched in order to obtain the desired pattern. Alternatively, this step can be effected in conjunction with the etching process carried out in step B. When through-passing mounting holes are used, the walls of the holes are conveniently plated prior to etching.

The final composite is illustrated in F. Thus, the method enables a circuit board containing desired conductor lay-outs suitable for closely packed components and circuits to be manufactured in a highly rational and comparatively inexpensive manner.

Figure 5:
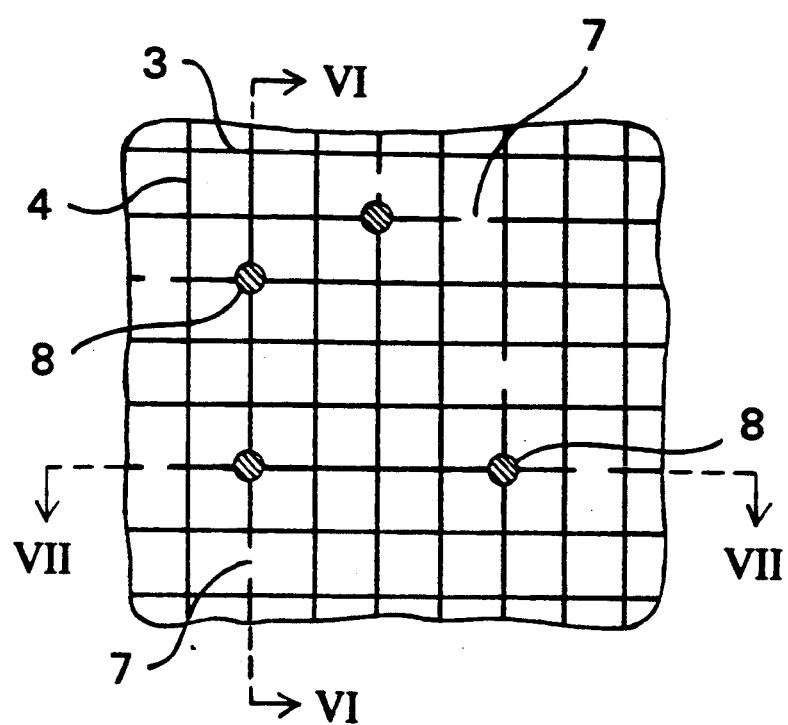
FIG. 5 illustrates schematically the conductor lay-out in a foil substrate according to FIG. 1, subsequent to forming interruptions and connections in the conductor paths.

FIG. 5 is a schematic illustration of the conductor matrix in the foil 1 subsequent to etching in order to establish interruptions in the conductor paths at locations 7, and subsequent to soldering for the purpose of establishing contact between mutually intersecting conductor paths at locations 8.

Figure 6:
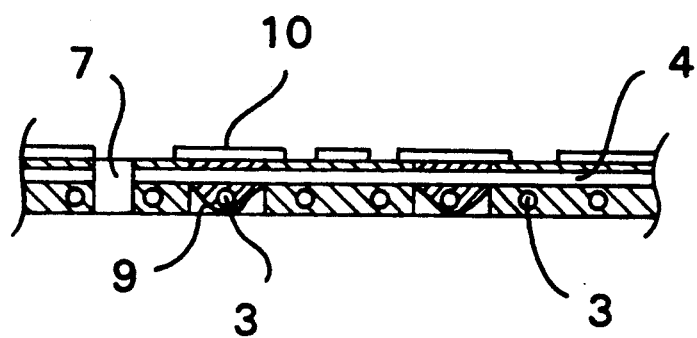
FIG. 6 is a sectional view of part of the arrangement illustrated in FIG. 5, said view being taken on the line VI—VI of said Figure.
Figure 7:
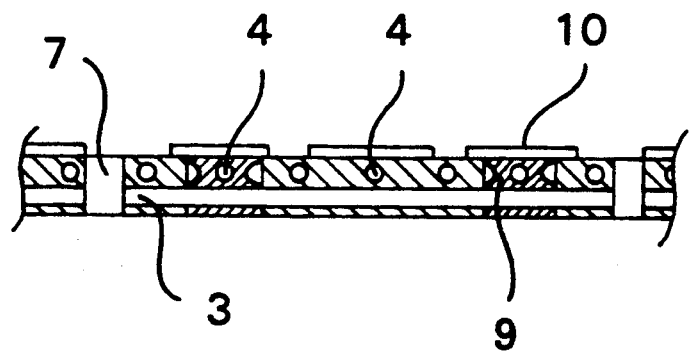
FIG. 7 is a sectional view of part of the arrangement illustrated in FIG. 5, said view being taken on the line VII—VII of said Figure.

It will be seen, in this regard, from FIGS. 6 and 7 that the conductor paths at desired intersection points are mutually connected by soldering, the solder 9 embracing both of the conductor paths concerned in a manner to provide a wide contact surface on respective conductors 3, 4. The solder is also in contact with residual surfaces 10 of the copper foil 2, these surfaces functioning as soldering surfaces for example.

Figure 8:
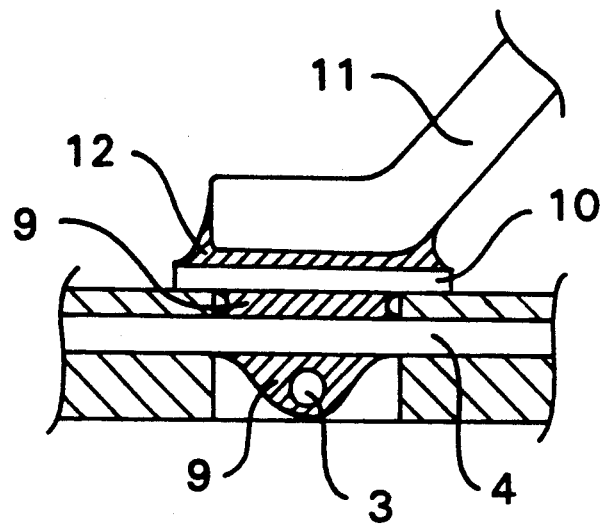
FIG. 8 illustrates a solder contact between two conductors and an associated adjoining contact surface.

FIG. 8 illustrates in larger scale an electrical connection which has been established between two mutually intersecting conductor paths by soldering, the solder 9 also being in contact with a soldering surface 10, as described above. A limb 11 of a component mounted on the card is attached to the soldering surface 10 by solder 12.

Figure 9:
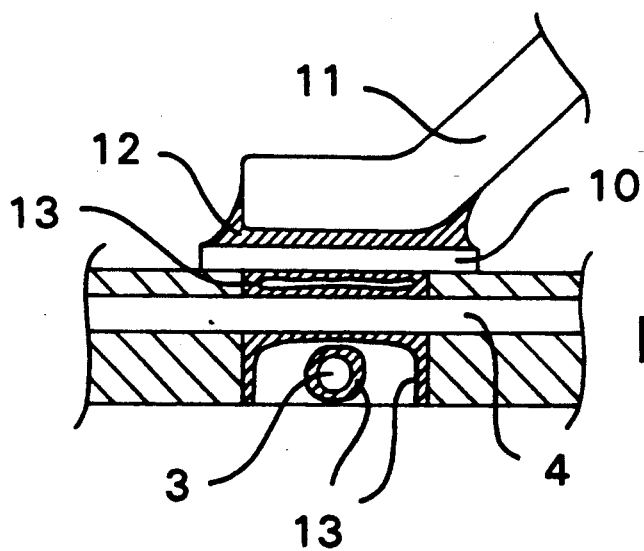
FIG. 9 illustrate a plated contact between two conductors and an associated adjoining contact surface.

As an alternative to solder, contact between a mutually intersecting pair of conductors can also be established by, e.g. plating, see FIG. 9. The exposed parts of the two conductor paths 3, 4 are in this case embraced by a metal film 13, e.g. applied by metalization, which is in electrical contact with a metal film on the wall of the drilled hole, resulting in electrical contact with the solder surface 10. Both of these alternatives result in highly reliable contact between the conductor paths and also between said paths and associated soldering surface or like surface.

Figure 10:
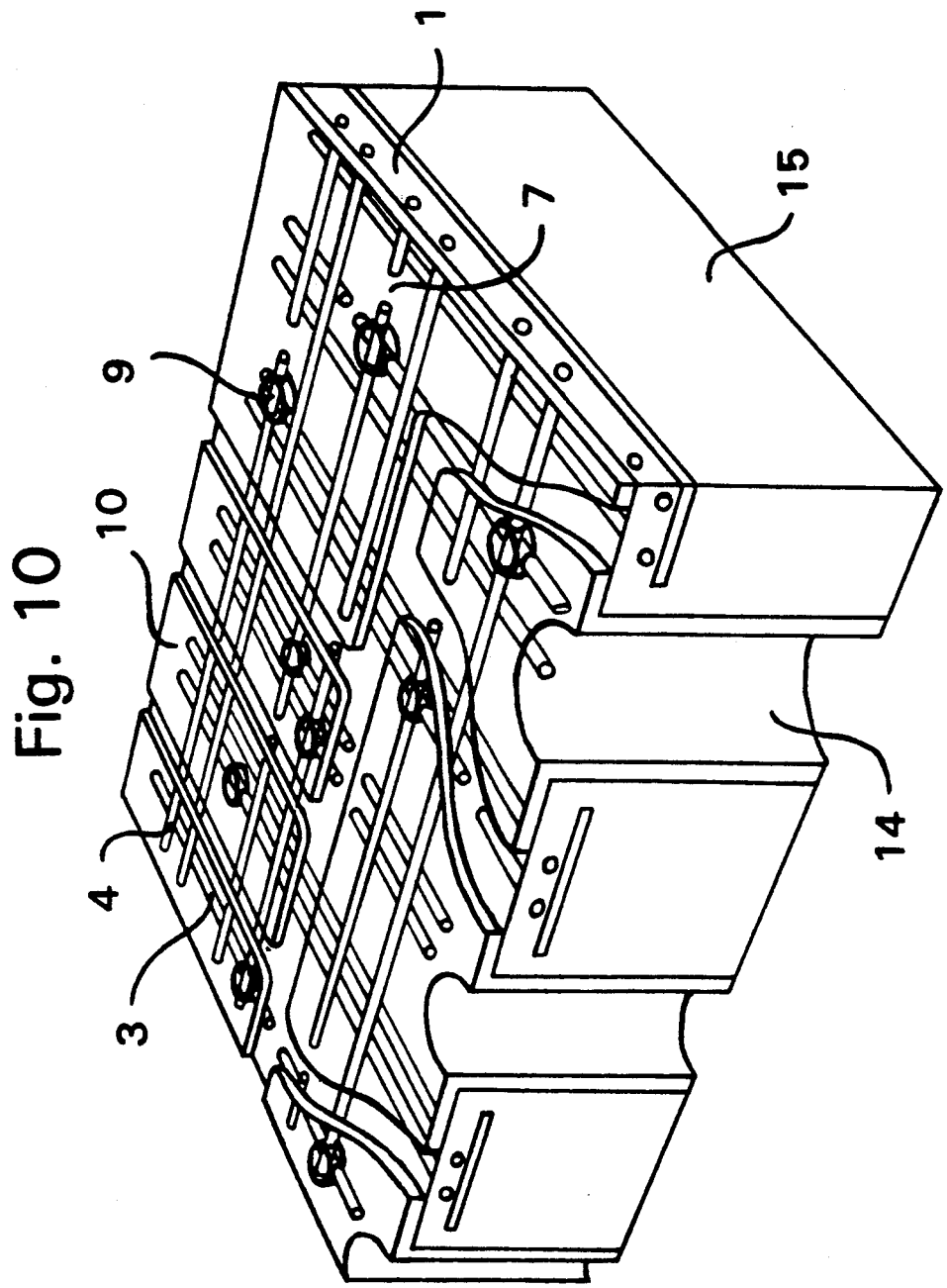
FIG. 10 illustrates schematically a circuit-board that has been produced in accordance with the invention.

FIG. 10 illustrates part of a circuit board which has been manufactured in accordance with the invention and which is ready to have electrical components fitted thereto. The same reference numerals as those used in the preceding Figures are used in the FIG. 10 illustration. The reference 14 identifies a plated hole for accommodating hole-mounted components, while the reference 16 identifies the aforementioned earthing surface.

The arrangement illustrated in FIG. 10 can be manufactured in a very rational manner, because all conductors are pre-formed, therewith enabling production to be effected with the aid of conventional apparatus, without requiring the use of special machines. The conductors may comprise wires having a wire dimension of 50–200 μm, and the substrate fill may have a thickness of from 0.2–1.0 mm. Spacing between the wires in the conductor matrix may, for example, be 1.27 mm, although narrower spacings and wider spacings are conceivable.

The invention has been described in the aforegoing with reference to an illustrated embodiment thereof. This embodiment, however, can be modified in several respects within the scope of the claims, inter alia, with regard to mounting of the external electrical components and circuits and the electrical contact between these components and circuits and the conductor paths. As will be understood, components can also be connected to individual conductors in the matrix, by applying the same technique as that described above.

Furthermore the substrate material may comprise any desired radiation-sensitive material which will enable the inventive method to be carried out.

It will also be understood that FIG. 4 represents only one of several conceivable manufacturing methods. For example, when plating techniques are used instead of soldering techniques, the method can be simplified in accordance with the following, wherewith a masking step is omitted. The foil produced in step A is covered with a thin layer, a chemical copper layer, about 2 μm thick. All of the foil is then masked, with the exception of those locations where connections are to be established, an electroplating process being carried out in two stages, first with copper and then with tin. Subsequent to removing the mask, all exposed copper is etched away, leaving the tin plating, which is resistant to the etching agent, unaffected. The conductor pattern in the copper layer on the outer side of the foil can be obtained in the same way, and in the same step, by employing a protective tin plating process.

I claim:

1. A method for manufacturing a circuit board on which electronic components and electrical circuits are to be mounted and mutually connected, said method comprising the steps of: arranging mutually isolated and intersecting electrical conductors in a substrate made of a material which is sensitive to a specific type of radiation, said conductors being arranged in an x/y matrix, irradiating the substrate with said specific type of radiation while screening locations at which conductor path interruptions are to be established and locations at which mutually intersecting conductor paths are to be permanently connected together, chemically removing the substrate material in the non-irradiated locations in order to expose the conductors at said locations, severing the exposed conductor paths by etching at locations where interruptions are desired and connecting the conductor paths together by soldering or plating at intersection locations where electrical connection is desired, wherein an electrically conductive foil is applied to a non-irradiated side of the substrate, substrate material is removed from the non-irradiated locations down to said electrically conductive foil; and the conductor paths are connected with one another and with the electrically conductive foil at those intersection locations where electrical contact is desired.

2. A method according to claim 1, characterized by using non-insulated electrical conductors and arranging the conductors int he substrate so as to be electrically isolated one from the other.

3. A method according to claim 1 or claim 2, characterized by using a substrate material which will harden when irradiated with electromagnetic radiation of given frequency, and by removing material from the non-irradiated locations by a development process.

4. A method according to claim 1, characterized by etching said foil in a manner to produce a desired conductor lay-out for the connection of external components and circuits to said board.

5. A method according to claim 4, characterized by etching the foil in conjunction with etching the exposed conductor paths to obtain the desired interruptions in said paths.

6. A method for manufacturing a circuit board on which electronic components are electrical circuits are to be mounted and mutually connected, said method comprising the steps of: arranging mutually isolated and intersection electrical conductors in a substrate made of a material which is sensitive to a specific type of radiation, said conductors being arranged in an x/y matrix, irradiating the substrate with said specific type of radiation while screening locations at which conductor path interruptions are to be established and locations at which mutually intersecting conductor paths are to be permanently connected together, chemically removing the substrate material in the non-irradiated locations in order to expose the conductors at said locations, severing the exposed conductor paths by etching at locations where interruptions are desired, connecting the conductor paths together by soldering or plating at intersection locations where electrical connection is desired, and applying to the irradiated surface of the substrate a stiffening base sheet provided with an electrically conductive foil which functions as a ground connection surface, with the foil facing towards said irradiated substrate surface.

7. A circuit board, characterized in that the board is manufactured by the method according to claims 1, 2, 4, 5 or 6.

* * * * *